United States Patent
Tsukai et al.

(10) Patent No.: US 6,577,043 B2
(45) Date of Patent: Jun. 10, 2003

(54) PIEZOELECTRIC RESONATOR AND ELECTRONIC DEVICE INCORPORATING THE SAME

(75) Inventors: Norimitsu Tsukai, Yamatokoriyama (JP); Masaki Takeuchi, Shiga-ken (JP); Yukio Yoshino, Otsu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/940,303

(22) Filed: Aug. 28, 2001

(65) Prior Publication Data

US 2002/0030420 A1 Mar. 14, 2002

(30) Foreign Application Priority Data

Aug. 31, 2000 (JP) .................................. 2000-262837
Aug. 8, 2001 (JP) .................................. 2001-240600

(51) Int. Cl.[7] .............................................. H01L 41/08
(52) U.S. Cl. ..................... 310/320; 310/324; 310/365
(58) Field of Search ............................. 310/320, 365, 310/366, 324

(56) References Cited

U.S. PATENT DOCUMENTS 2,185,599 A * 1/1940 Mason ...................... 310/365
4,356,421 A * 10/1982 Shimizu et al. ............. 310/320
5,789,845 A * 8/1998 Wadaka et al. ............. 310/334

FOREIGN PATENT DOCUMENTS

| JP | 46-25579 | 7/1971 | |
| JP | 0138392 | * 10/1979 | ................ 310/365 |
| JP | 5-160666 | 6/1993 | |
| JP | 8-154032 | 6/1996 | |
| SU | 218237 | * 5/1968 | ................ 310/365 |

* cited by examiner

*Primary Examiner*—Mark O. Budd
(74) *Attorney, Agent, or Firm*—Keating & Bennett, LLP

(57) ABSTRACT

A highly compact piezoelectric resonator having excellent resonant characteristics and very small resonant resistance includes an upper electrode disposed on one of two main surfaces of a piezoelectric film and a lower electrode disposed on the other main surface of the piezoelectric film. The upper electrode includes a first external-signal extracting electrode, a first leading electrode, and three first vibrating electrodes. The lower electrode includes a second external-signal extracting electrode, a second leading electrode, and three second vibrating electrodes. The three first vibrating electrodes are arranged substantially perpendicularly to the three second vibrating electrodes via the piezoelectric film. Vibrating sections are located at positions where the first vibrating electrodes are arranged substantially perpendicularly to the second vibrating electrodes.

25 Claims, 5 Drawing Sheets

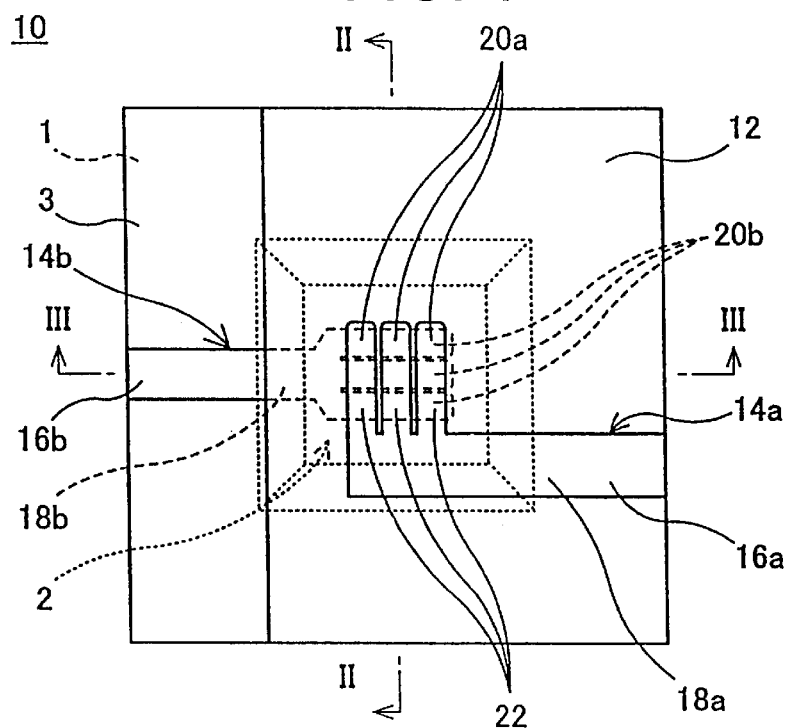
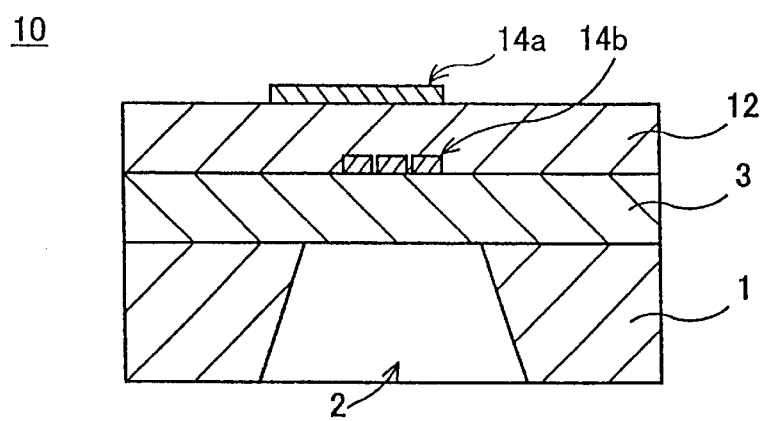
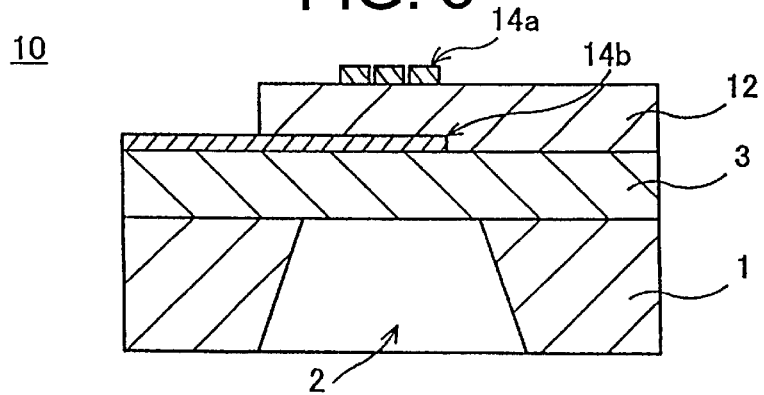

PIEZOELECTRIC RESONATOR AND ELECTRONIC DEVICE INCORPORATING THE SAME

BACKGROUND OF THE INVENTION

1. Field of the Invention

The present invention relates to piezoelectric resonators and electronic devices incorporating such piezoelectric resonators. More particularly, the present invention relates to piezoelectric resonators including piezoelectric layers such as piezoelectric films or piezoelectric substrates and electrodes disposed on both main surfaces of the piezoelectric layers. In addition, the invention relates to electronic devices incorporating such piezoelectric resonators, such as filters.

2. Description of the Related Art

As a background relating to the present invention, conventional piezoelectric resonators are described in Japanese Examined Patent Application Publication No. 46-25579, Japanese Unexamined Patent Application Publication No. 8-154032, and Japanese Unexamined Patent Application Publication No. 5-160666.

Japanese Examined Patent Application Publication No. 46-25579 describes a piezoelectric oscillator including a multi-layer substrate, first and second electrodes, and a piezoelectric film.

Japanese Unexamined Patent Application Publication No. 8-154032 describes a piezoelectric resonator including a piezoelectric substrate, first and second electrodes disposed on one main surface of the piezoelectric substrate, a third electrode disposed on the other main surface of the piezoelectric substrate. In this piezoelectric resonator, two vibrating sections are connected in series at locations where the first and second electrodes oppose the third electrode.

In addition, Japanese Unexamined Patent Application Publication No. 5-160666 describes a piezoelectric resonator including a piezoelectric substrate and electrodes disposed on both main surfaces of the piezoelectric substrate.

Concerning the piezoelectric oscillator described in Japanese Examined Patent Application Publication No. 46-25579, in order to reduce a resonance resistance, the dimensions of the electrodes disposed on both main surfaces of the piezoelectric film must be expanded to increase the area in which the electrodes oppose each other so that a greater capacitance can be obtained. On the other hand, expanding the dimensions of the electrodes on the main surfaces of the piezoelectric film causes unnecessary vibrations, which thereby leads to the deterioration of resonant characteristics.

Thus, in order to prevent the resonant characteristics from being deteriorated while reducing the resonance resistance and neglecting the unnecessary vibrations, one possible method is to connect in parallel a plurality of piezoelectric resonators having small electrode-opposing areas. However, in this case, since the entire chip size increases, there is a problem in that wiring for connecting piezoelectric resonators is elongated.

Furthermore, in the piezoelectric resonator described in Japanese Unexamined Patent Application Publication No. 8-154032, when the resonant resistance of each vibrating section is represented by the symbol R, the entire resonant resistance is equivalent to 2R. In order to reduce the entire resonant resistance, it is necessary to reduce the resonant resistance of each vibrating section. In order to do so, the electrode-opposing area needs to be increased. As a result, unnecessary vibrations are no longer negligible, resulting in the deterioration of the resonant characteristics.

Furthermore, in the piezoelectric resonator described in Japanese Unexamined Patent Application Publication No. 5-160666, when electrode patterns disposed on the main surfaces of the piezoelectric substrate deviate from each other, the electrode-opposing area varies and the resonant frequencies become different from each other. Thus, even with n pieces of the piezoelectric resonators connected in parallel, the resonant resistance is not reduced to be 1/n.

SUMMARY OF THE INVENTION

In order to overcome the problems described above, preferred embodiments of the present invention provide a very compact piezoelectric resonator having excellent resonant characteristics and very small resonance resistance.

Also, other preferred embodiments of the present invention provide an electronic device including such a novel piezoelectric resonator.

According to a first preferred embodiment of the present invention, a piezoelectric resonator which vibrates in a thickness vibration mode, includes a piezoelectric layer, a first electrode disposed on a main surface of the piezoelectric layer, the first electrode including a leading electrode and at least one vibrating electrode connected to the leading electrode, a second electrode disposed on the other main surface of the piezoelectric layer, the second electrode including a leading electrode and at least one vibrating electrode connected to the leading electrode, and a plurality of vibrating sections at which the at least one vibrating electrode of the first electrode overlaps with the at least one vibrating electrode of the second electrode via the piezoelectric layer, the plurality of vibrating sections being connected in parallel.

In this piezoelectric resonator, preferably, a distance between adjacent vibrating sections is equal to or greater than about ½ of a wavelength at which the adjacent vibrating sections vibrate.

According to a second preferred embodiment of the invention, an electronic device includes at least one piezoelectric resonator according to the first preferred embodiment described above.

In the piezoelectric resonator according to preferred embodiments of the present invention, in each vibrating section, the dimensions of the vibrating electrodes of the first and second electrodes can be made small enough to prevent the influence of unnecessary vibrations. Thus, the resonant characteristics are not deteriorated.

Moreover, in piezoelectric resonators of preferred embodiments of the present invention, even when the first electrode deviates from the second electrode, the area in which the vibrating electrodes oppose each other does not change. Thus, the resonant resistance of each vibrating section and the resonant frequency do not change.

In addition, in piezoelectric resonators of preferred embodiments of the present invention, the plurality of vibrating sections are preferably formed by overlapping the vibrating electrodes of the first electrode with the vibrating electrodes of the second electrode via the piezoelectric layer. Thus, the plurality of vibrating sections can be arranged in a very small area.

In addition, in piezoelectric resonators according to preferred embodiments of the present invention, since the plurality of vibrating sections is electrically connected in parallel to each other, the resonant resistance is smaller than the resonant resistance of each vibrating section.

Furthermore, in the piezoelectric resonators according to preferred embodiments of the present invention, when the distance between the adjacent vibrating sections is equal to or greater than about ½ of the wavelength at which the adjacent vibrating sections vibrate, vibrations leaking in lateral directions are attenuated and eliminated. Consequently, the vibrations of the adjacent vibrating sections do not interfere with each other and thereby the resonant characteristics are not deteriorated.

The above and other features, elements, characteristics and advantages of the present invention will be further clarified by detailed explanations of preferred embodiments of the present invention with reference to the drawings.

BRIEF DESCRIPTION OF THE DRAWINGS

FIG. 1 is a plan view of a piezoelectric resonator according to a first preferred embodiment of the present invention;

FIG. 2 is a II—II line sectional view of FIG. 1.

FIG. 3 is a III—III line sectional view of FIG. 1.

DETAILED DESCRIPTION OF PREFERRED EMBODIMENTS

Figure 4:
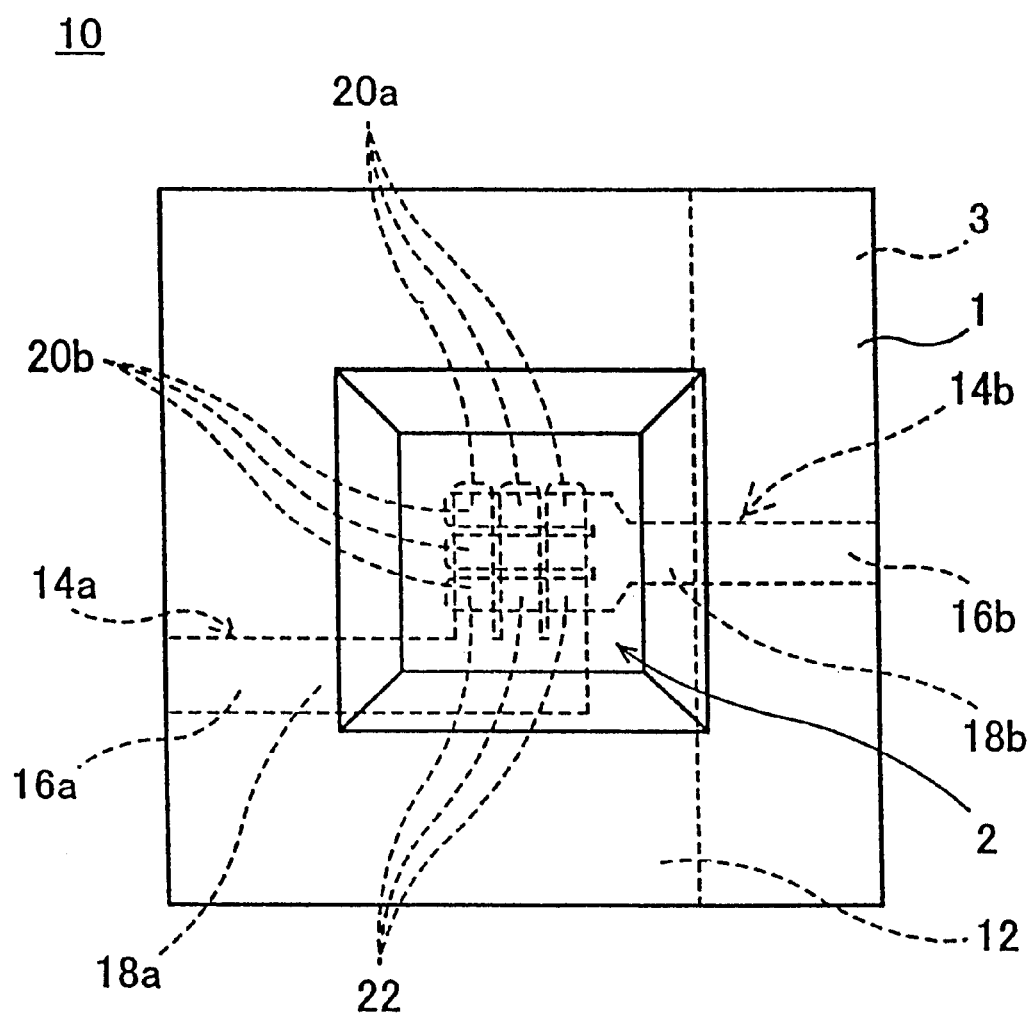
FIG. 4 is a bottom view of the piezoelectric resonator shown in FIG. 1.

FIG. 1 is a plan view showing an example of a piezoelectric resonator according to a preferred embodiment of the present invention. FIG. 2 is a II—II line sectional view of FIG. 1 and FIG. 3 is a III—III line sectional view of FIG. 1. FIG. 4 is a bottom view of FIG. 1.

The piezoelectric resonator 10 shown in FIGS. 1 to 4 is a thin film piezoelectric resonator that preferably includes a base 1, a supporting film 3, a piezoelectric film 12 defining a piezoelectric layer, an upper electrode 14a defining a first electrode, and a lower electrode 14b defining a second electrode. The base 1 preferably includes an inorganic matter such as Si. The supporting film 3 is disposed on the base 1 and preferably made of a dielectric material such as $SiO_2$, for example. A substantially rectangular vibrating space 2 may be formed at a center portion of the base 1, for example. This vibrating space 2 is preferably formed by etching a back surface of the base 1. The lower electrode 14b is disposed on the supporting film 3. The piezoelectric film 12 preferably has a substantially rectangular shape on the lower electrode 14b and is preferably made of one of ZnO, AlN, or other suitable material. The upper electrode 14a is disposed on the piezoelectric film 12.

The upper electrode 14a preferably includes an external-signal extracting electrode 16a, a leading electrode 18a, and three vibrating electrodes 20a. The external-signal extracting electrode 16a preferably has a substantially rectangular configuration in the intermediate position of an end portion on the first main surface of the piezoelectric film 12. The leading electrode 18a preferably has a strap-like shape extending from the external-signal extracting electrode 16a to the approximate center of the first main surface of the piezoelectric film 12. The width of the leading electrode 18a is preferably substantially equal to the width of the external-signal extracting electrode 16a. The three vibrating electrodes 20a are arranged to extend from the leading electrode 18a to the approximate center of the first main surface of the piezoelectric film 12. The three vibrating electrodes 20a are preferably bent at angles of 90 degrees with respect to the leading electrode 18a at some distance therebetween. Furthermore, in this situation, the three vibrating electrodes 20a are preferably narrow enough to prevent the influence of unnecessary vibrations.

The lower electrode 14b includes an external-signal extracting electrode 16b, a leading electrode 18b, and three vibrating electrodes 20b. The external-signal extracting electrode 16b preferably has a substantially rectangular configuration in the approximate center of an end portion of the second main surface, which opposes the end portion of the first main surface, where the electrode 16a is arranged. The leading electrode 18b preferably has a substantially strap-like shape extending from the external-signal extracting electrode 16b to the approximate center of the second main surface of the piezoelectric film 12. The leading electrode 18b preferably has substantially the same width as the width of the external-signal extracting electrode 16b. The three vibrating electrodes 20b are arranged to extend from the leading electrode 18b to the approximate center of the second main surface of the piezoelectric film 12. In this situation, the three vibrating electrodes 20b are arranged in parallel to the leading electrode 18b and spaced from each other by a distance therebetween. Furthermore, the widths of the three vibrating electrodes 20b are preferably narrow enough to prevent the influence of unnecessary vibrations.

The three electrodes 20a of the upper electrode 14a are arranged substantially perpendicularly to the three electrodes 20b of the lower electrode 14b via the piezoelectric layer 12. Nine parts defined by arranging the three electrodes 20a substantially perpendicularly to the three electrodes 20b constitute nine vibrating sections 22. In this situation, the three electrodes 20a are connected to the leading electrode 18a and the three electrodes 20b are connected to the leading electrode 18b. Consequently, the vibrating sections 22 are connected in parallel.

In the piezoelectric resonator 10 shown in each of FIGS. 1 to 4, regarding each of the vibrating sections 22, the dimensions of the vibrating electrodes 20a of the upper side electrode 14a and the dimensions of the vibrating electrodes 20b of the lower side electrode 14b are preferably smaller than dimensions causing the influence of unnecessary vibrations. As a result, the deterioration of the resonant characteristics is reliably prevented.

In addition, in this piezoelectric resonator 10, even when the upper electrode 14a deviates from the lower electrode 14b, the areas in which the vibrating electrodes 20a oppose the vibrating electrodes 20b do not change. Thus, the resonant resistances and the resonant frequencies of the vibrating sections 22 do not change, and instead remain substantially equal to one another.

Furthermore, in the piezoelectric resonator 10, the three vibrating electrodes 20a overlap with the three vibrating electrodes 20b via the piezoelectric film 12 to define the nine vibrating sections 22. Accordingly, many vibrating sections 22 can be arranged in a very small area.

In addition, in the piezoelectric resonator 10, the nine vibrating sections 22 having the substantially equal resonant frequencies are electrically connected in parallel. Thus, entirely, with no unnecessary vibrations caused, the resonant resistance is reduced to be 1/9 of the resonant resistance of each vibrating section 22.

As shown above, in the piezoelectric resonator 10 shown in each of FIGS. 1 to 4, with no influence of unnecessary vibrations caused, the nine vibrating sections 22 having the substantially equal resonant frequencies are arranged in a lattice-like configuration and electrically connected in parallel. As a result, entirely, with no unnecessary vibrations caused, the resonant resistance is 1/9 of the resonant resistance of each vibrating section 22 in the small area.

In the piezoelectric resonator 10, a distance between adjacent vibrating sections 22 is preferably substantially equal to or greater than about ½ of a wavelength at which each vibrating section 22 vibrates. With this arrangement, vibrations leaking in lateral directions are sufficiently attenuated and eliminated. Thus, since the vibrations of the adjacent vibrating sections 22 do not interfere with one another, the resonant characteristics are not deteriorated.

FIG. 3 shows a plan view of a piezoelectric resonator according to a second preferred embodiment of the present invention. FIG. 6 shows a bottom view of the piezoelectric resonator. In a piezoelectric resonator 10 shown in each of FIGS. 5 and 6, when compared with the piezoelectric resonator 10 shown in each of FIGS. 1 and 2, the widths of leading electrodes 18a and 18b are narrower. In addition, vibrating electrodes 20a and 20b are bent at angles of approximately 45 degrees with respect to the leading electrodes 18a and 18b and are spaced in two rows such that the vibrating electrodes 20a are substantially perpendicular to the vibrating electrodes 20b via the piezoelectric film 12.

Figure 5:
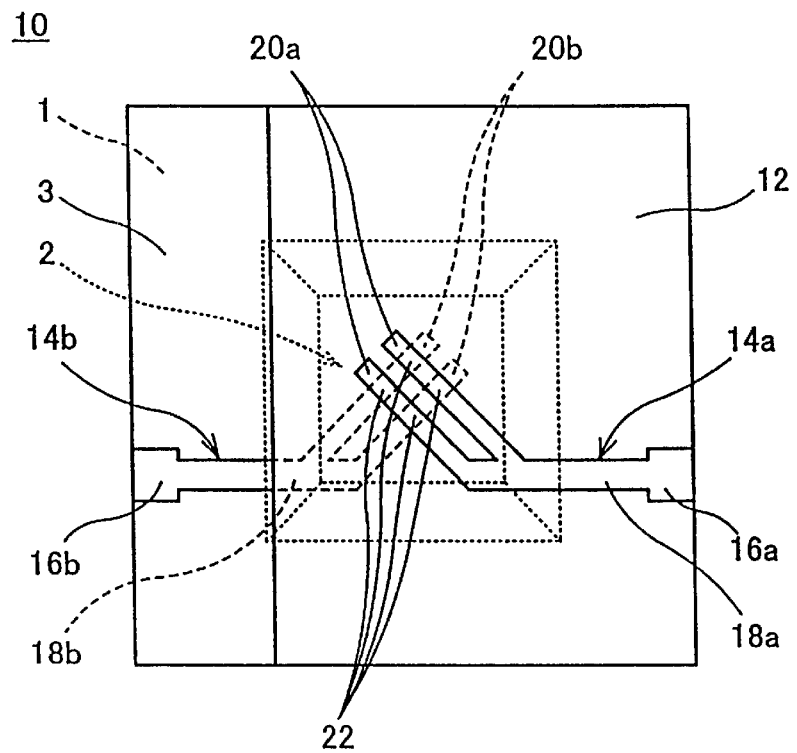
FIG. 5 shows a plan view of a piezoelectric resonator according to a second preferred embodiment of the present invention.
Figure 6:
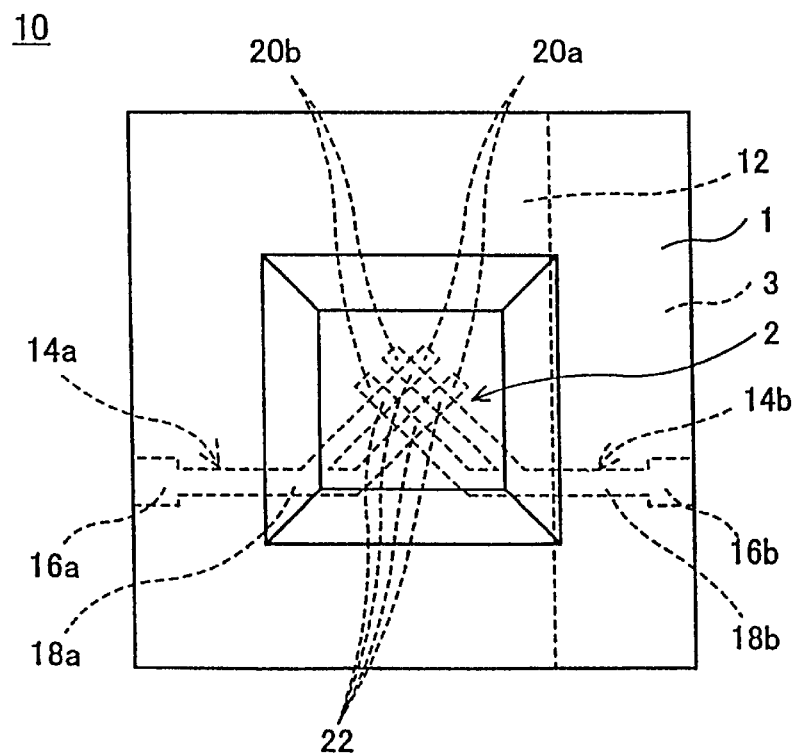
FIG. 6 shows a bottom view of the piezoelectric resonator shown in FIG. 5.

In the piezoelectric resonator 10 shown in each of FIGS. 5 and 6, when compared with the piezoelectric resonator 10 shown in each of FIGS. 1 and 2, the vibrating electrodes 20a and 20b are bent at the angle less than about 90 degrees with respect to the leading electrodes 18a and 18b. Thus, there can be obtained another advantage that unnecessary reflection of external signals at high frequencies can be prevented. In the present invention, the angle for bending the vibrating electrodes with respect to the leading electrodes may be arbitrarily changed.

Figure 7:
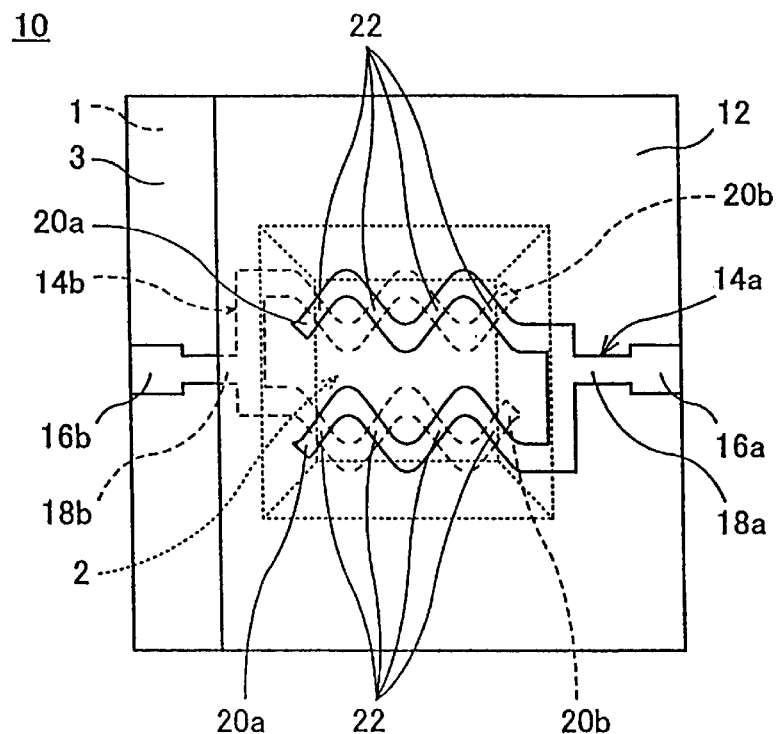
FIG. 7 shows a plan view of a piezoelectric resonator according to a third preferred embodiment of the present invention.
Figure 8:
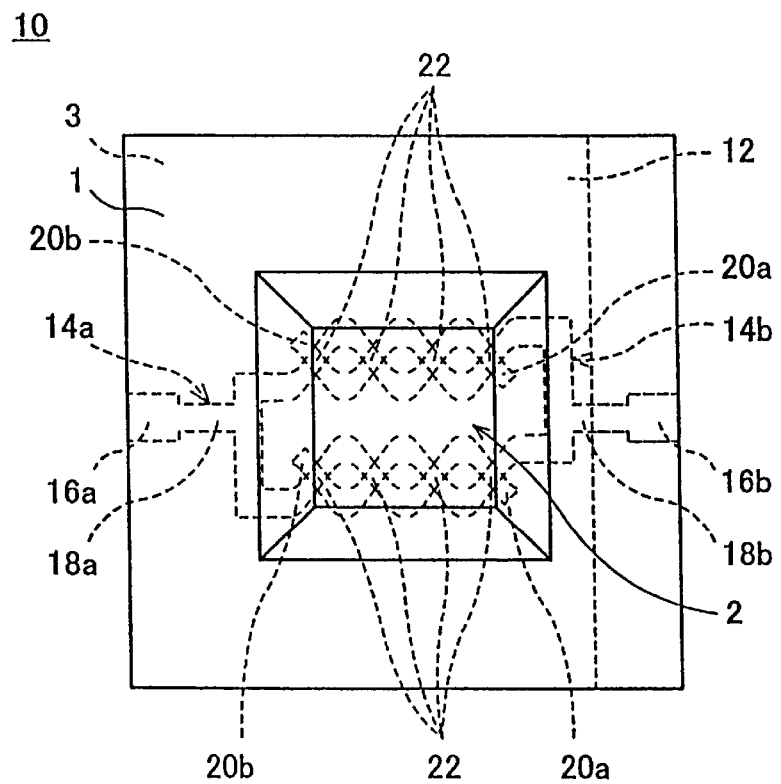
FIG. 8 shows a bottom view of the piezoelectric resonator shown in FIG. 7.

FIG. 7 shows a plan view of a piezoelectric resonator according to a third preferred embodiment of the present invention. FIG. 8 shows a bottom view of the piezoelectric resonator. In a piezoelectric resonator 10 shown in each of FIGS. 7 and 8, unlike the piezoelectric resonator 10 shown in each of FIGS. 1 to 6, pairs of corrugated vibrating electrodes 20a of an upper electrode 14a and corrugated vibrating electrodes 20b of a lower electrode 14b are arranged such that the repeatedly curving electrodes 20a and 20b overlap with each other via a piezoelectric film 12.

In the piezoelectric resonator 10 shown in each of FIGS. 7 and 8, unlike the piezoelectric resonator 10 shown in each of FIGS. 1 to 6, since the vibrating electrodes 20a and 20b are not bent with respect to leading electrodes 18a and 18b, the external-signal extracting electrodes 16a and 16b can be connected to the vibrating electrodes 20a and 20b. Thus, unlike the piezoelectric resonator 10 shown in each of FIGS. 1 and 4, there is obtained another advantage that unnecessary reflection of external signals at high frequencies is prevented. Even when the vibrating electrodes have configurations other than corrugated configurations, the same advantages can be obtained.

Figure 9:
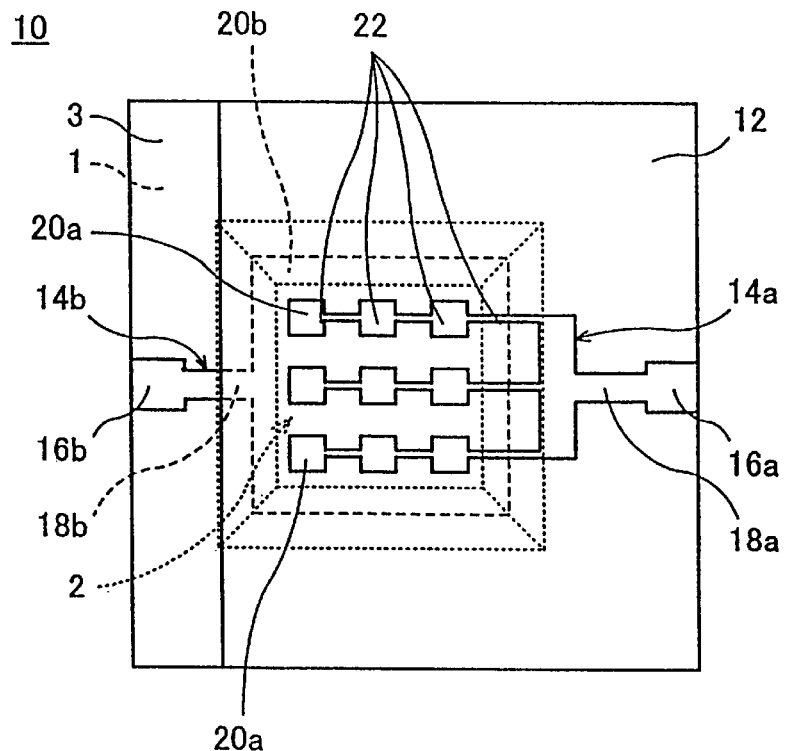
FIG. 9 shows a plan view of a piezoelectric resonator according to a fourth preferred embodiment of the present invention.
Figure 10:
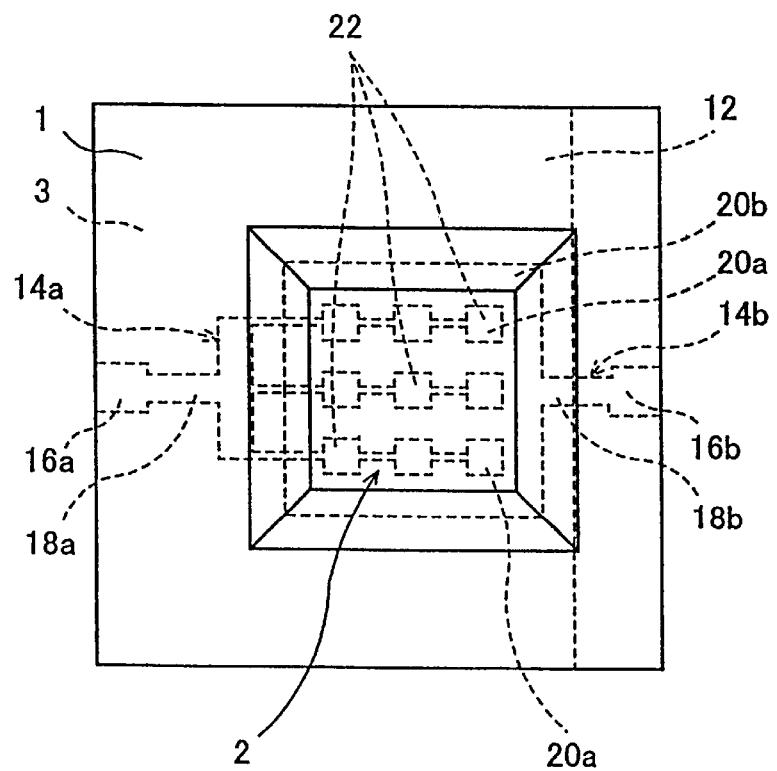
FIG. 10 shows a bottom view of the piezoelectric resonator shown in FIG. 9.

FIG. 9 shows a plan view of a piezoelectric resonator according to a fourth preferred embodiment of the present invention. FIG. 10 shows a bottom view of the piezoelectric resonator. In a piezoelectric resonator 10 shown in each of FIGS. 9 and 10, unlike the piezoelectric resonator 10 shown in each of FIGS. 1 to 8, as vibrating electrodes 20a of an upper electrode 14a, three pieces of electrodes having three small electrodes connected in series are spaced in parallel. As an alternative to vibrating electrodes 20b of a lower electrode 14b, one wide electrode is arranged. In this situation, the vibrating electrodes 20a are arranged to overlap with parts of the vibrating electrode 20b via a piezoelectric film 12.

In the piezoelectric resonator 10 shown in each of FIGS. 9 and 10, unlike the piezoelectric resonator 10 shown in each of FIGS. 1 to 8, when forming the electrodes, there are no residues generated in the lower electrode 14b and dust or other particles are prevented from entering the electrode 14b. Thus, there can be obtained additional advantage that the rate of product defects due to residues and dust is minimized.

In this piezoelectric resonator 10, the upper electrode 14a and the lower electrode 14b having the features described above may be positionally switched.

In addition, in each of the above piezoelectric resonators 10, the piezoelectric film is preferably used as a piezoelectric layer. However, a piezoelectric substrate may be used as the piezoelectric layer of the present invention.

Furthermore, in each of the piezoelectric resonators 10 described above, although the vibrating sections 22 are preferably rectangular or substantially rectangular, the vibrating sections used in the present invention may be formed in any shape such as a substantially round shape or substantially square shape.

Furthermore, not only can this invention be applied to a piezoelectric resonator but also the present invention can be applied to an electronic device including a piezoelectric resonator, such as a filter or other electronic device.

As described above, the present invention provides a very compact piezoelectric resonator having excellent resonant characteristics and a very small resonance resistance.

Moreover, the present invention can provide an electronic device incorporating the above-described piezoelectric resonator, such as a filter.

While preferred embodiments of the invention have been illustrated and described above, it is to be understood that various modifications and changes will be apparent to those skilled in the art without departing from the spirit and scope of the invention.

What is claimed is:

1. A piezoelectric resonator comprising:

a piezoelectric layer having first and second main surfaces;

a first electrode disposed on the first main surface of said piezoelectric layer, said first electrode including a leading electrode and at least one vibrating electrode connected to said leading electrode;

a second electrode disposed on the second main surface of said layer, said second electrode including a leading electrode and at least one vibrating electrode connected to said leading electrode; and a plurality of vibrating sections at which said at least one vibrating electrode of said first electrode overlaps with said at least one vibrating electrode of said second electrode via said piezoelectric layer, said plurality of vibrating sections being connected in parallel; wherein each of the first and second electrodes includes pairs of corrugated vibrating electrodes.

2. A piezoelectric resonator according to claim 1, wherein said plurality of vibrating sections are arranged to generate vibration in a thickness vibration mode.

3. A piezoelectric resonator according to claim 1, wherein a distance between adjacent vibrating sections is equal to or greater than about ½ of a wavelength at which said adjacent vibrating sections vibrate.

4. A piezoelectric resonator according to claim 1, further comprising a base and a supporting film disposed on the base, the piezoelectric layer being disposed on the supporting film.

5. A piezoelectric resonator according to claim 4, wherein the first electrode is an upper electrode and is disposed on the piezoelectric layer and the second electrode is a lower electrode and is disposed on the supporting film.

6. A piezoelectric resonator according to claim 5, wherein a substantially rectangular vibrating space is located at an approximate center portion of the base.

7. A piezoelectric resonator according to claim 1, wherein the piezoelectric layer comprises one of a piezoelectric thin film and a piezoelectric substrate.

8. A piezoelectric resonator according to claim 1, wherein the piezoelectric film has a substantially rectangular shape.

9. A piezoelectric resonator according to claim 1, wherein the piezoelectric film is made of one of ZnO and AlN.

10. A piezoelectric resonator according to claim 1, wherein at least one of the first electrode and the second electrode includes an external-signal extracting electrode.

11. A piezoelectric resonator according to claim 1, wherein each of the first electrode and the second electrode includes an extemal-signal extracting electrode.

12. A piezoelectric resonator according to claim 1, wherein the pairs of corrugated vibrating electrodes of the first electrode overlap the pairs of corrugated vibrating electrodes of the second electrode via the piezoelectric layer.

13. An electronic device comprising the piezoelectric resonator according to claim 1.

14. A piezoelectric resonator, comprising:
a piezoelectric layer having first and second main surfaces;
a first electrode disposed on the first main surface of said piezoelectric layer, said first electrode including a leading electrode and at least one vibrating electrode connected to said leading electrode;
a second electrode disposed on the second main surface of said layer, said second electrode including a leading electrode and a plurality of vibrating electrodes connected to said leading electrode; and
a plurality of vibrating sections at which said at least one vibrating electrode of said first electrode overlaps with said plurality of vibrating electrode of said second electrode via said piezoelectric layer, said plurality of vibrating sections being connected in parallel; wherein each of said plurality of vibrating electrodes of said second electrode are connected in series to at least one other of said plurality of vibrating electrodes of said second electrode via connecting electrodes; and
said connecting electrodes have a width that is substantially less than a width of each of said plurality of vibrating electrodes.

15. A piezoelectric resonator according to claim 14, wherein said plurality of vibrating sections are arranged to generate vibration in a thickness vibration mode.

16. A piezoelectric resonator according to claim 14, wherein a distance between adjacent vibrating sections is equal to or greater than about ½ of a wavelength at which said adjacent vibrating sections vibrate.

17. A piezoelectric resonator according to claim 14, further comprising a base and a supporting film disposed on the base, the piezoelectric layer being disposed on the supporting film.

18. A piezoelectric resonator according to claim 17, wherein the first electrode is an upper electrode and is disposed on the piezoelectric layer and the second electrode is a lower electrode and is disposed on the supporting film.

19. A piezoelectric resonator according to claim 18, wherein a substantially rectangular vibrating space is located at an approximate center portion of the base.

20. A piezoelectric resonator according to claim 14, wherein the piezoelectric layer comprises one of a piezoelectric thin film and a piezoelectric substrate.

21. A piezoelectric resonator according to claim 14, wherein the piezoelectric film has a substantially rectangular shape.

22. A piezoelectric resonator according to claim 14, wherein the piezoelectric film is made of one of ZnO and AlN.

23. A piezoelectric resonator according to claim 14, wherein at least one of the first electrode and the second electrode includes an external-signal extracting electrode.

24. A piezoelectric resonator according to claim 14, wherein each of the first electrode and the second electrode includes an external-signal extracting electrode.

25. An electronic device comprising the piezoelectric resonator according to claim 14.

* * * * *